(12) United States Patent
Lin et al.

(10) Patent No.: US 6,200,848 B1
(45) Date of Patent: Mar. 13, 2001

(54) METHOD OF FABRICATING SELF-ALIGNED CONTACT IN EMBEDDED DRAM

(75) Inventors: Yung-Chang Lin, Feng-Yuan; Jacob Chen, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/208,612

(22) Filed: Dec. 8, 1998

(51) Int. Cl.[7] .................................................. H01L 21/8242
(52) U.S. Cl. ........................ 438/241; 438/270; 438/706; 437/41; 437/44; 437/203; 437/228; 437/235
(58) Field of Search ..................................... 438/241, 270, 438/706; 437/41, 44, 203, 228, 235

(56) References Cited

U.S. PATENT DOCUMENTS

| | | | |
|---|---|---|---|
| 5,665,619 | * 9/1997 | Kwan et al. | 438/270 |
| 5,683,922 | * 11/1997 | Jeng et al. | 437/41 |
| 5,728,595 | * 3/1998 | Fukase | 437/44 |
| 6,001,743 | * 12/1999 | Lee et al. | 438/706 |

* cited by examiner

Primary Examiner—Richard Elms
Assistant Examiner—Pho Luy
(74) Attorney, Agent, or Firm—Oppenheimer Wolff & Donnelly, LLP

(57) ABSTRACT

A method of fabricating a self-aligned contact. A substrate is defined as a memory region and a logic region. Metal oxide semiconductors and source/drain regions are respectively formed in the memory region and in the logic region. A defined dielectric layer is formed over the substrate. Contact holes are respectively formed in the memory region and in the logic region until the source/drain regions are exposed. Silicide layers are formed over the contact holes. Portions of the silicide layer extend to surface of the dielectric layer neighboring the contact holes. A defined inter-layer dielectric layer is formed over the substrate. Vias are respectively formed in the memory region and in the logic region. The vias are filled with conductive layers. The self-aligned contact is formed.

20 Claims, 6 Drawing Sheets

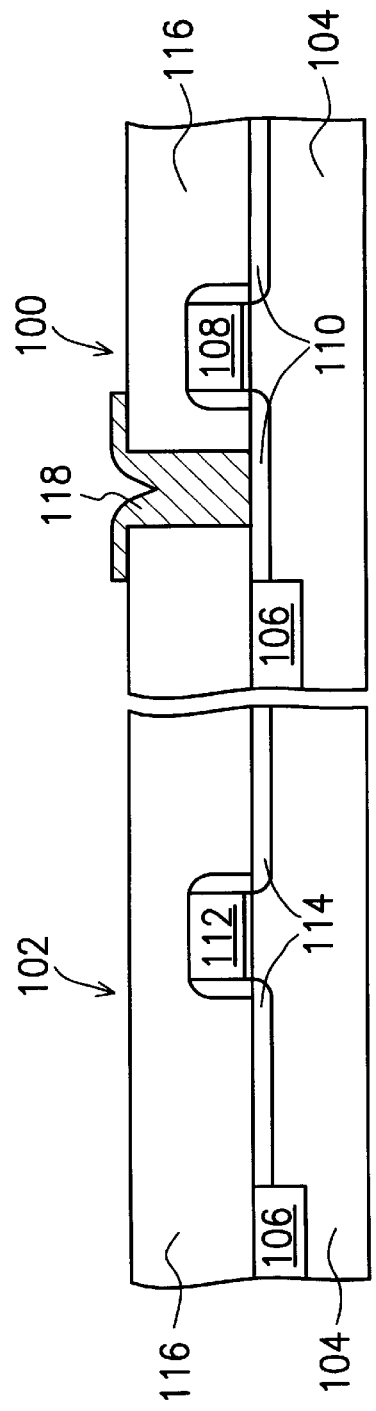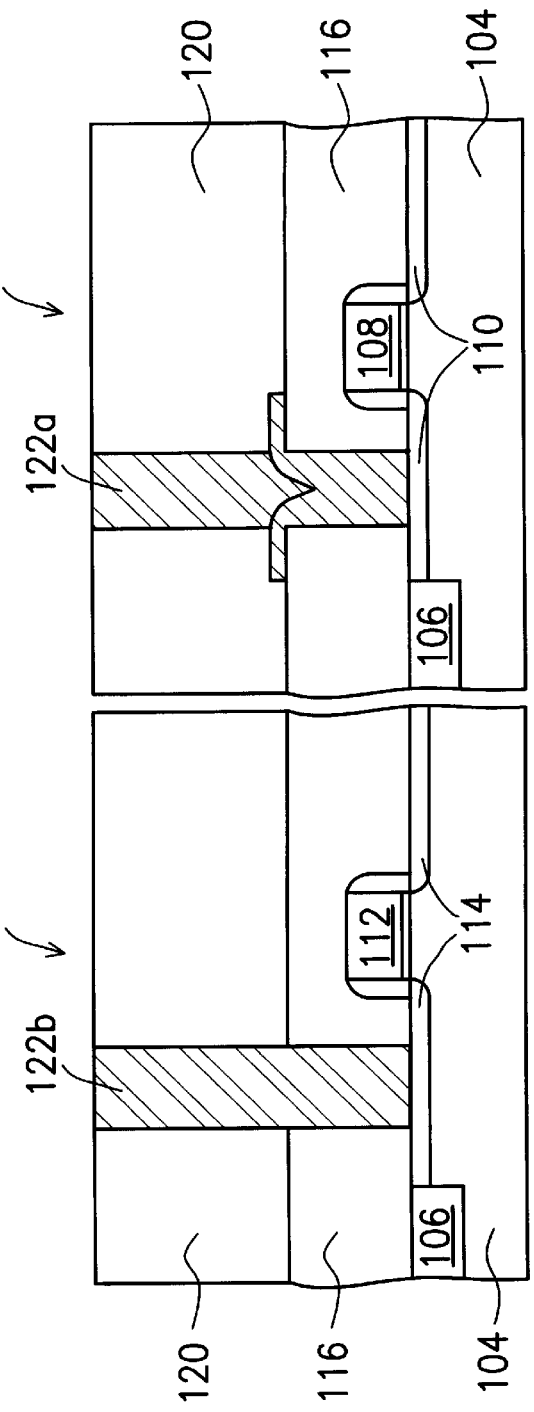
FIG. 1A (PRIOR ART)
FIG. 1B (PRIOR ART)

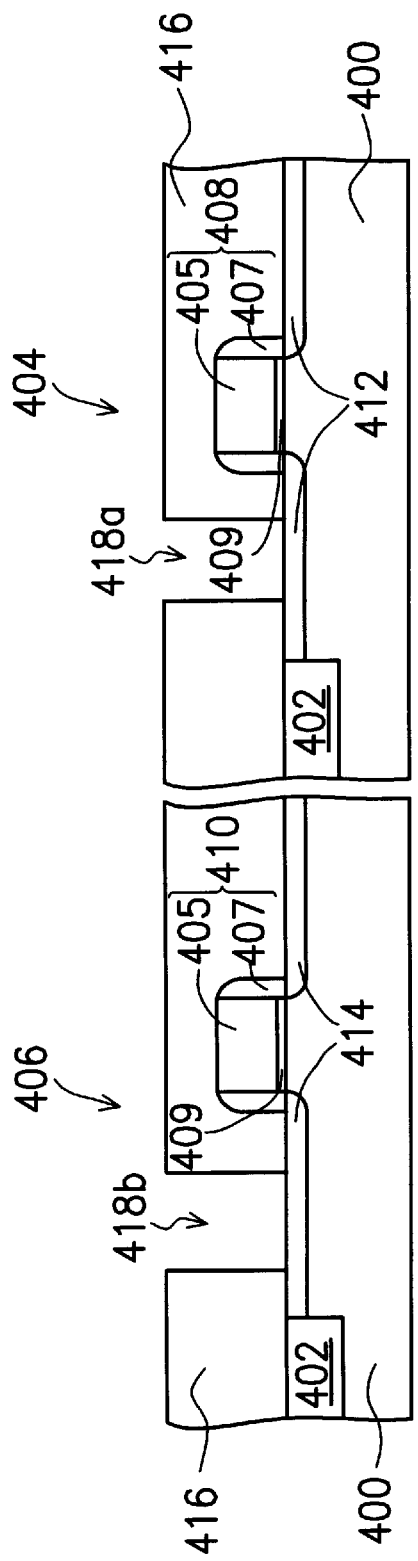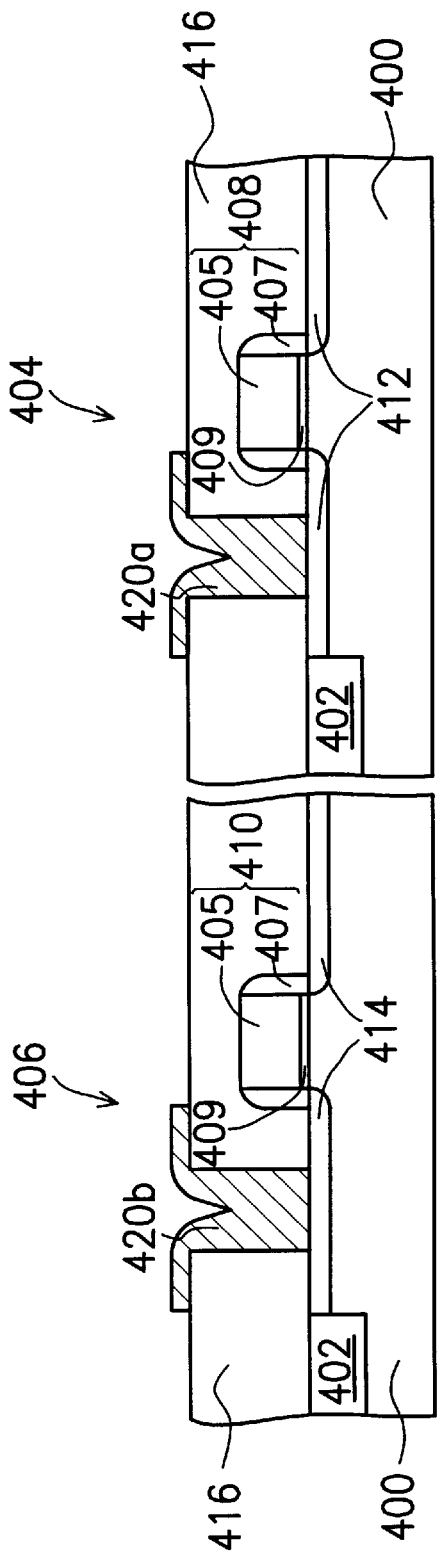
FIG. 4A
FIG. 4B

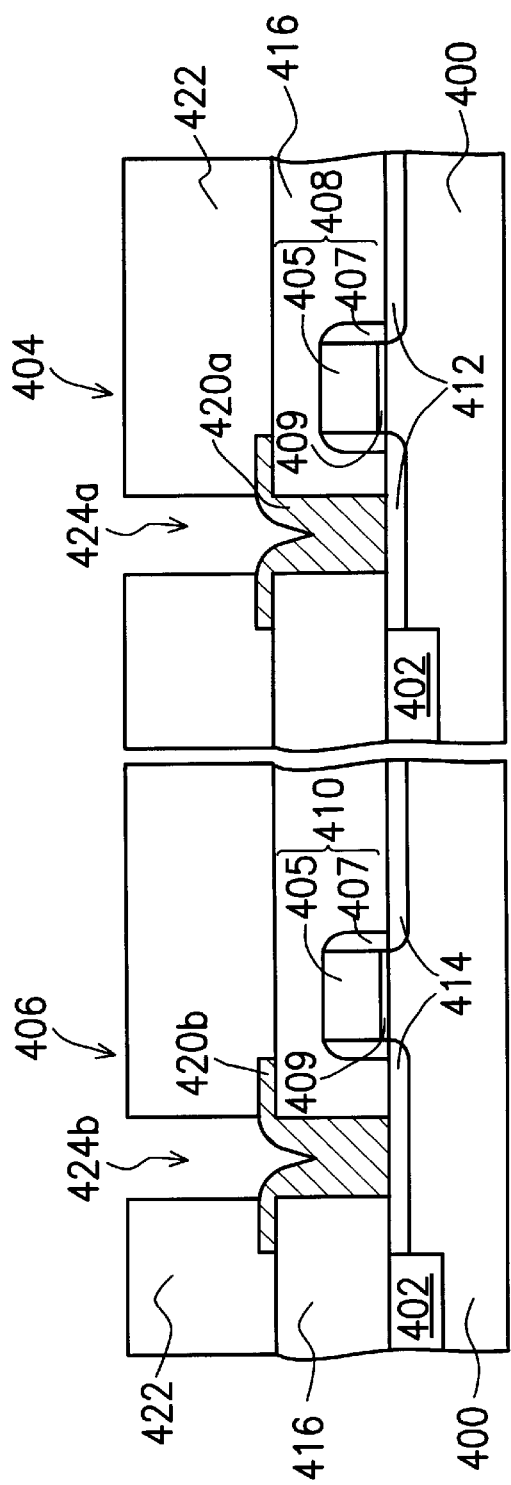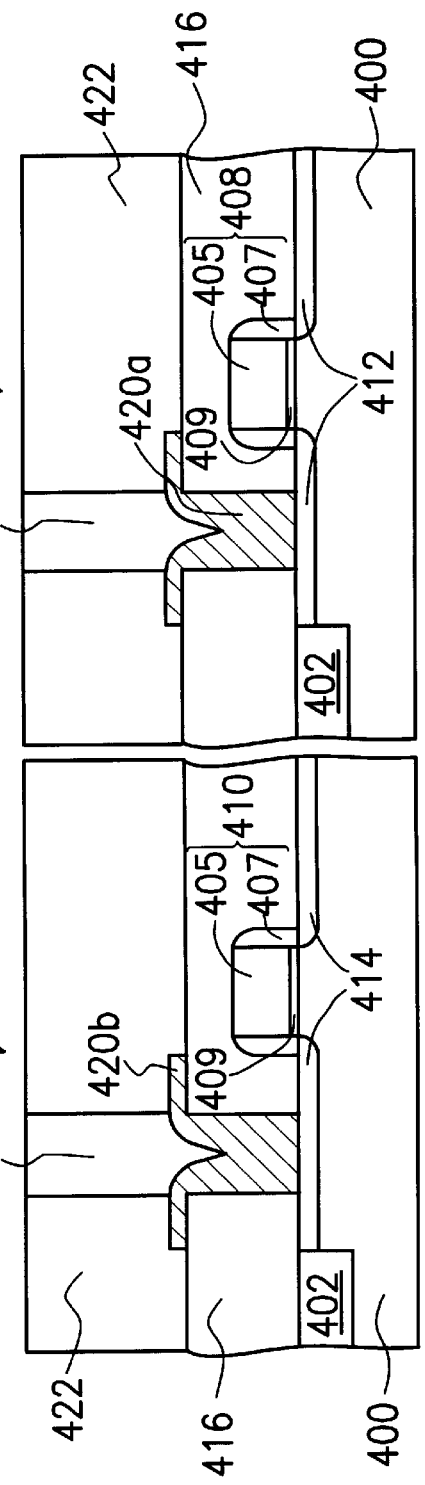
FIG. 4C
FIG. 4D

METHOD OF FABRICATING SELF-ALIGNED CONTACT IN EMBEDDED DRAM

BACKGROUND OF THE INVENTION

1. Field of Invention

The present invention relates to a method of fabricating a self-aligned contact (SAC). More particularly, the present invention relates to a method of fabricating a contact in an embedded dynamic random access memory (DRAM).

2. Description of Related Art

FIGS. 1A through 1B are schematic, cross-sectional views showing a conventional method of fabricating a self-aligned contact in an embedded DRAM. Referring to FIG. 1A, a semiconductor substrate 104 is provided. A shallow trench isolation (STI) structure 106 is formed on the substrate 104 to define a memory region 100 and a logic region 102 in an embedded dynamic random access memory (DRAM). The memory region 100 has an N-type metal oxide semiconductor (MOS) 108 and an N-type source/drain region 110 formed therein. The logic region 102 has an N/P-type MOS 112 having a dual gate structure and an N-type source/drain region 114 formed therein. A dielectric layer 116 is formed on the substrate 100 to cover the NMOS 108 and the N/PMOS 112. The dielectric layer 116 is patterned to form a contact hole in the memory region 100. The contact hole is filled with a conductive layer 118, which is composed of a polysilicon layer with doped N-type ions and a tungsten silicide layer. A portion of the conductive layer 118 extends to surface of the dielectric layer 116 neighboring the contact hole. Thus, the conductive layer 118 can be electrically coupled to the source/drain region 110.

Referring to FIG. 1B, an inter-layer electric (ILD) layer 120 is deposited over the substrate 104. Then, a planarization process is performed. Via holes are respectively formed in the memory region 100 and in the logic region 102 by photolithography and etching methods. The via holes are filled with a tungsten layer to respectively form vias 122a, 122b in the memory region 100 and in the logic region 102. Thus, the vias 122a, 122b can be electrically coupled to the conductive layer 118 in the contact hole and the source/drain regions 110.

While etching the inter-layer electric layer 120 to form the via 122a in the memory region 100 and the via 122b in the logic region 102, the tungsten layer of the conductive layer 118 and the silicon substrate 104 are respectively used as the etching stops. Due to the different etching stops and much different etching depths, alignment is difficult in the etching process, even when the etching stops are over-etched. The via 122b in the logic region 102 has larger aspect ratio because of the much deeper via 122b. Therefore, it is more difficult to align in the etching process.

In order to improve the alignment process mentioned above, a contact filled with a conductive layer of N-type doped polysilicon/tungsten silicide can be formed in the logic region 102 during alignment contact formation in the dielectric layer 116 in the memory region 100. The conductive layer in the logic region 102 is electrically coupled to the source/drain region 114. However, the MOS 112 in the logic region 102 has an N/P type dual gate structure, and a junction will be appear between the PMOS source/drain region 114 and the N-type conductive layer in the logic region 102. This is not the required electric connection. Therefore, the method is not used to solve the problem of the different depths while etching.

In addition, a method of forming a borderless contact is also used to overcome the difficulties of the different etching depths in the memory region and in the logic region due to the gradually reduced dimension of semiconductors. But it still has many problems, as shown as FIG. 2. FIG. 2 is a schematic, cross-sectional view showing a borderless contact. The distance between a MOS 202 and a STI structure 204 are much smaller to fit the design rule. A borderless contact 208 is formed in a dielectric layer 206. In order to reduce dimensions of devices, a portion of the borderless contact 208 is formed above the STI structure 204. Since the material of both the dielectric layer 206 and the STI structure 204 is oxide, it is difficult to stop on the substrate 200 while etching the dielectric layer 206 to form a contact hole 208, so that the substrate 200 is over-etched. An undesired trench 210 is formed in the substrate 200. Current leakage will occur while filling with a conductive layer in the later process.

FIG. 3 is a schematic, cross-sectional view showing a borderless contact. An oxide layer 304 and a silicon nitride layer 306 are sequentially formed over a MOS structure 302 on a substrate 300. A planarized dielectric layer 308 is formed over the substrate 300. A borderless contact hole 310 will be formed by photolithography and etching methods. While etching the dielectric layer 308, the silicon nitride layer 306 is first used as an etching stop. Then, the etched thickness of the oxide layer 304 is accurately controlled while etching the oxide layer 304. A source/drain region 312 beside the MOS 302 is completely exposed. Thus, a conductive layer formed subsequently can be easily coupled to a source/drain region 312 beside the MOS 302. However, the required etched depth of the contact hole 310 in the embedded DRAM is about 22000 Å. Since the dielectric layer 308 is much thicker than the silicon nitride layer 306, the silicon nitride layer 306 is over-etched during the forming step of the contact hole 310. It causes the process in which the silicon nitride layer 306 is used as an etching stop to fail. If thickness of the silicon nitride layer 306 is increased, problems of stress will develop. Therefore, the borderless contact cannot achieve its efficacy in the above-mentioned conditions.

SUMMARY OF THE INVENTION

Accordingly, the present invention is to provide a method for overcoming difficulties of forming and aligning a contact hole, because thickness of dielectric layers in a memory region and in a logic region are much different.

Another purpose of the invention is to provide a method for improving current leakage caused by over-etching a contact hole while forming a borderless contact hole.

To achieve these and other advantages and in accordance with the purpose of the invention, as embodied and broadly described herein, the invention provides a method of fabricating a self-aligned contact (SAC). A substrate is defined as a memory region and a logic region. MOS structures and source/drain regions are respectively formed in the memory region and in the logic region. A patterned dielectric layer is formed over the substrate. Contact holes are respectively formed in the memory region and in the logic region to expose the source/drain regions. The contact hole is filled with a silicide layer. A portion of the silicide layer extends to the surface of the dielectric layer neighboring the contact hole. A defined inter-layer dielectric layer is formed over the substrate. Then, vias are respectively formed in the memory region and in the logic region. The vias are filled with conductive layers. Thus, a self-aligned contact is formed.

To achieve these and other advantages and in accordance with the purpose of the invention, as embodied and broadly described herein, the invention provides a method of fabricating a self-aligned contact. A substrate is defined as a memory region and a logic region. MOS structures and source/drain regions are respectively formed in the memory region and in the logic region. An oxide layer, a hard material layer and a defined dielectric layer are sequentially formed over the substrate. Contact holes are respectively formed in the memory region and in the logic region to expose the hard material layer. The hard material layer exposed by the contact holes is removed to expose the oxide layer. Then, the exposed oxide layer is removed to expose the source/drain region. The contact hole is filled with a silicide layer. A portion of the silicide layer extends to surface of the dielectric layer neighboring the contact hole. A defined inter-layer dielectric layer is formed over the substrate. Vias are respectively formed in the memory region and in the logic region. The vias are filled with conductive layers. Then, a self-aligned contact is formed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of he invention, and are incorporated in and constitute a part of this specification. The drawings illustrate embodiments of the invention and, together with the description, serve to explain the principles of the invention. In the drawings, FIGS. 1A to 1B are schematic, cross-sectional views showing a conventional method of fabricating a self-aligned contact of an embedded DRAM;

FIGS. 4A to 4D are schematic, cross-sectional views showing a method of fabricating a self-aligned contact of an embedded DRAM according to a first preferred embodiment of this invention.

DESCRIPTION OF THE PREFERRED EMBODIMENTS

Figure 2:
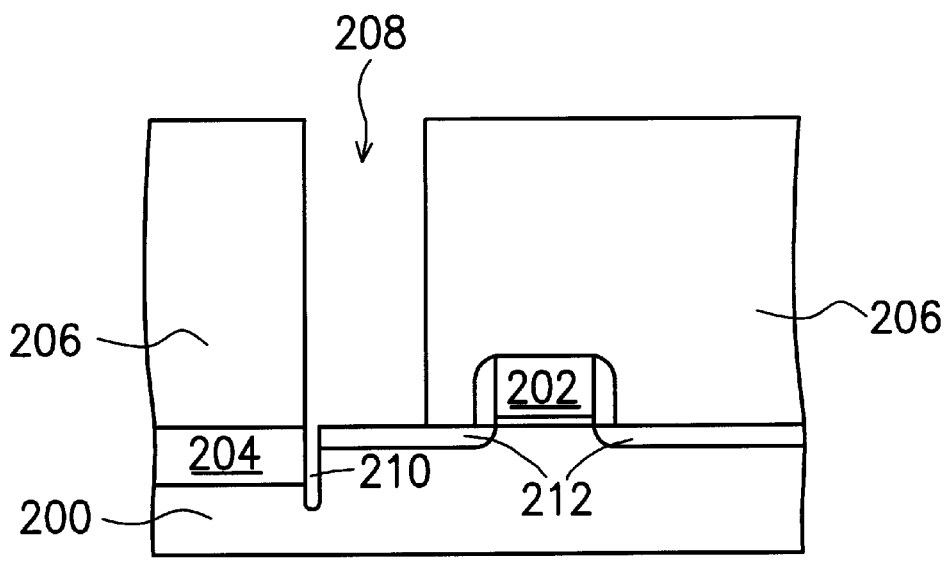
FIG. 2 is a schematic, cross-sectional view showing a borderless contact.
Figure 3:
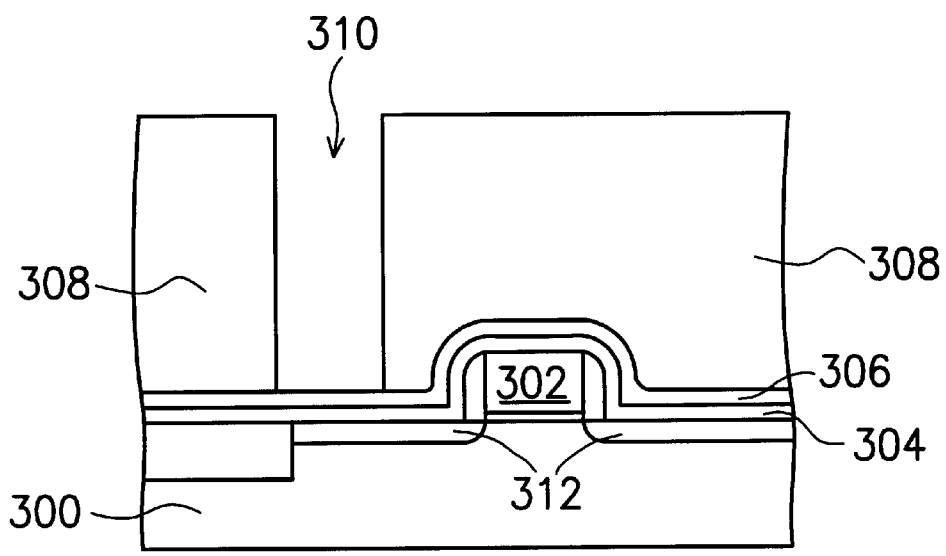
FIG. 3 is a schematic, cross-sectional view showing a borderless contact.

Reference will now be made in detail to the present preferred embodiments of the invention, examples of which are illustrated in the accompanying drawings. Wherever possible, the same reference numbers are used in the drawings and the description to refer to the same or like parts.
The First Embodiment Due to different etching stops and etching depths in a memory region and in a logic region while forming a contact hole, it is more difficult to etch the contact hole by the conventional method of fabricating an embedded DRAM. It cannot entirely solve the problems mentioned above to use a borderless contact. Therefore, the invention provides a method of forming a self-aligned contact (SAC). A silicide layer is respectively formed in contact holes in a memory region and in a logic region. The silicide layer can be used as material filling the contact hole and an etching stop while forming the contact holes. Thus, the required etching depth can be lowered while forming the contact hole in the logic region. Therefore, the difference between the etching depths in the memory and in the logic region becomes smaller.

FIGS. 4A to 4D are schematic, cross-sectional views showing a method of fabricating a self-aligned contact in an embedded DRAM according to the first embodiment of the invention.

Referring to FIG. 4A, a shallow trench isolation (STI) structure 402 is formed on a substrate 400 to define a memory region 404 and a logic region 406. A polysilicon layer 405 is formed on the substrate 400. By photolithography and etching methods, a gate structure 408 is formed in the memory region 404 and a dual gate structure 410 is formed in the logic region 406. The steps of forming the gate structure 408 and the dual gate structure 410 include forming a gate oxide layer 409 between the substrate 400 and the polysilicon layer 405 and forming spacers 407 on sidewalls of the defined polysilicon layer 405 and the defined gate oxide layer 409. The steps also include respectively forming source/drain regions 412, 414 on the substrate 400 in the gate structure 408 and in the dual gate structure 410. The step of forming the source/drain regions includes an ion implantation step and an annealing step. The above-mentioned processes are performed to respectively form MOS structures in the memory region 404 and the logic region 406. The MOS structure in the memory region 404 comprises a gate structure 408 and a source/drain region 412. The MOS structure in the logic region 406 comprises a dual gate structure 410 and a source/drain region 414.

Still referring to FIG. 4A, a dielectric layer 416, such as an oxide layer, is formed on the substrate 400 to cover the gate structure 408 and the dual gate structure 410, for example, by a chemical vapor deposition method. The dielectric layer 416 is defined to form a contact hole. The definition step includes, for example, forming a photoresist on the dielectric layer 416, and forming a contact hole 418a in the dielectric layer 416 in the memory region 404 by photolithography and etching processes. The source/drain region 412 beside the gate structure 408 is exposed by the contact hole 418a. In addition, a contact hole 418b is formed in the dielectric layer 416 in the logic region 406 to expose the source/drain region 414 beside the dual gate structure 410 by the above-mentioned photolithography and etching processes.

A silicide layer is formed on the dielectric layer 416, for example, by a sputtering method or a chemical vapor polishing method. The contact holes 420a, 420b are filled with the silicide layer. The silicide layer is defined so that a portion of the silicide layer is removed. Another portion of the silicide layers 420a, 420b covering the contact hole is left. A portion of the silicide layer left in the contact hole extends to the surface of the dielectric layer 416 neighboring the contact hole, in which the silicide layers 420a, 420b include $TiSi_x$, $COSi_x$ and the like. Since the contact holes 418a, 418b are respectively filled with the silicide layers 420a, 420b and the silicide layers 420a, 420b are electrically coupled to the source/drain regions 412, 414 in the memory region 404 and in the logic region 406, the top of the silicide layers 420a, 420b are the same level. Therefore, etching stops in the memory region 404 and in the logic region 406 are the same while forming vias subsequently. Therefore, over-etching caused by a larger difference between the etching depths in the memory and in the logic regions can be avoided. In addition, the invention uses the silicide as conductive material filling the contact hole 418a, 418b, not polysilicon and tungsten silicon used in the conventional process, so that a junction caused by the different electricity between the conductive material in the contact hole and the source/drain region in the logic region can be avoided. The conductive material in the contact hole is successfully electrically coupled to the source/drain region in the logic region using the silicide layer 420a, 420b as conductive material.

Referring to FIG. 4C, processes for forming memory cells (not shown) are performed in the memory region 404. An inter-layer dielectric layer 422, such as a borophosphosilicate glass (BPSG) layer, is formed over the substrate 400, for example, by chemical vapor deposition (CVD). A chemical mechanical polishing process is preformed for planarization. The inter-layer dielectric layer 422 is defined to respectively form vias 424a, 424b in the memory region 404 and the logic region 406 by photolithography and etching methods. The silicide layer 420a, 420b are exposed by the vias 424a, 424b. While etching the inter-layer dielectric layer 422 to form the vias 424a, 424b, etching stops in the memory region 404 and in the logic region 406 are the same and the difference of the required etched depths in the memory region 404 and in the logic region 406 become smaller. Therefore, the difficulties caused by the larger aspect ratio of conventional process can be improved. Plus, the portions of the silicide layer extend to the surface of the dielectric layer 416 neighboring the contact hole, so that the exposed area of the conductive material is increased. Therefore, the alignment problem for forming the vias can be solved. Subsequently, metal plugs 426a, 426b are formed in the vias 424a, 424b by any conventional methods. The metal plugs 426a, 426b can be electrically coupled to the silicide layer 420a, 420b further to connect the source/drain region 412, 414.

The Second Embodiment

Combining a borderless contact with the invention can avoid over-etching while forming the borderless contact. Thus, dimension of a device can be reduced using the borderless contact in the invention. FIGS. 5A to 5D are schematic, cross-sectional views showing a method of fabricating a self-aligned contact of an embedded DRAM according to the preferred embodiment of this invention.

Figure 5A:
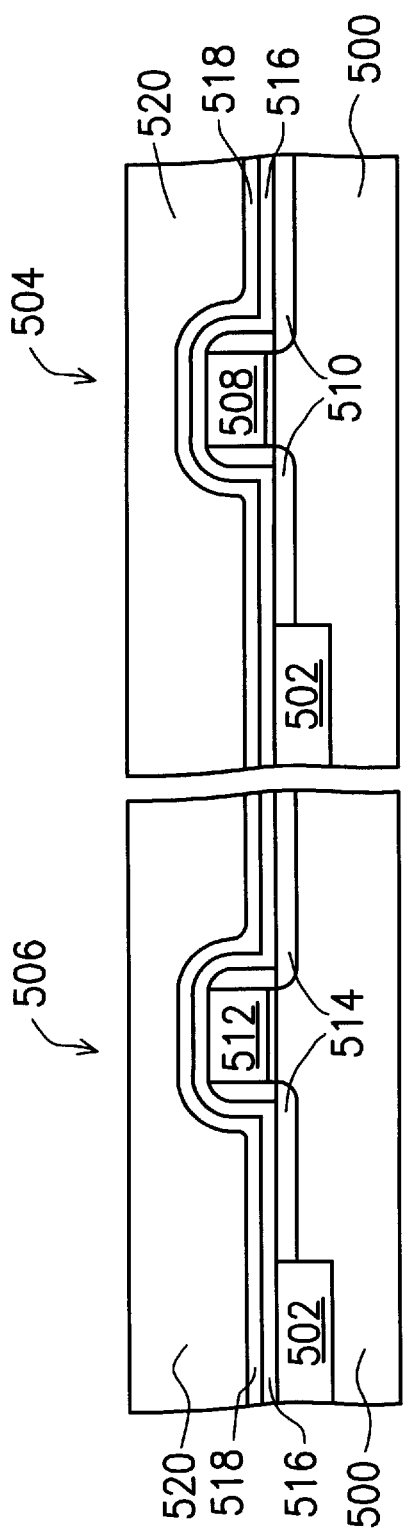
FIGS. 5A to 5D are schematic, cross-sectional views showing a method of fabricating a self-aligned contact of an embedded DRAM according to a second preferred embodiment of this invention.

Referring to FIG. 5A, a semiconductor substrate 500 is provided. A shallow trench isolation structure 502 is formed on the substrate 500. The substrate 500 is defined as a memory region 504 and a logic region 506. A gate structure 508 and a source/drain region 510 are formed in the memory region 504. Simultaneously, a dual gate structure 512 and a source/drain region 514 are formed in the logic region 506. An oxide layer 516, a hard material layer 518 and a dielectric layer 520 are sequentially formed over the substrate 500. The hard material 518 includes, for example, a silicon nitride layer. The dielectric layer 520 includes, for example, an oxide layer.

Figure 5B:
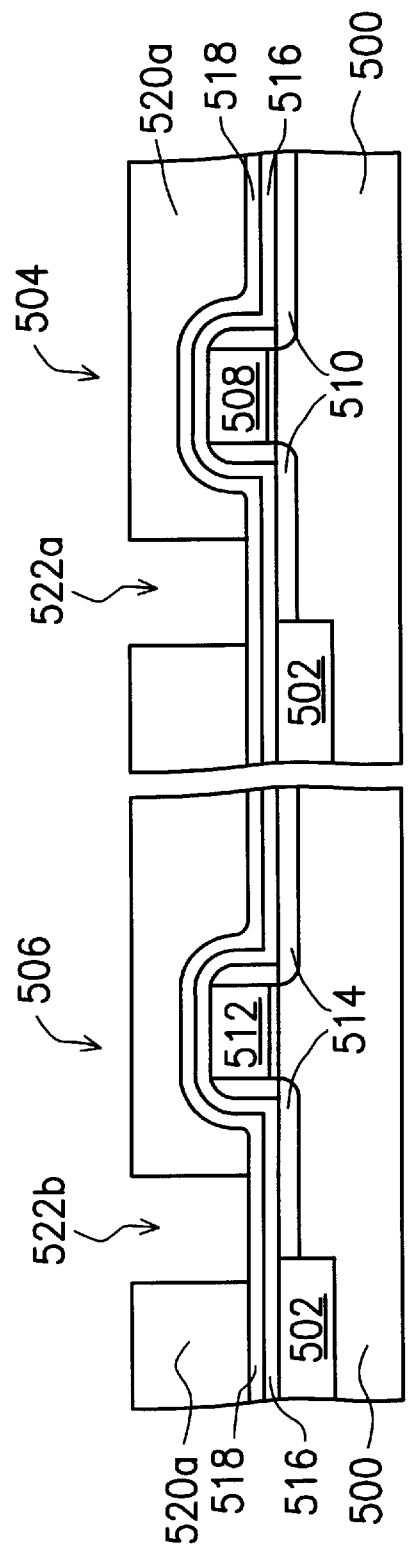
Figure 5C:
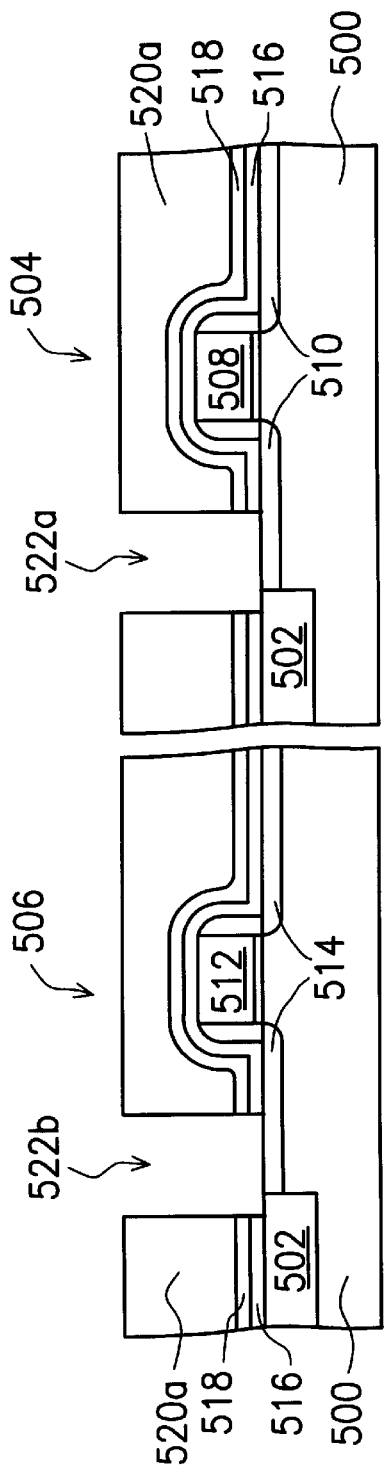

As shown as FIG. 5B, contact holes 522a, 522b are respectively formed in the memory region 504 and in the logic region 506 by defining the dielectric layer 520 using the material layer 518 as an etching stop. The hard material layer 518 is exposed by the contact hole 522a. 522b. A portion of the contact holes 522a, 522b is formed above the trench isolation structure 502.

The hard material layer 518 exposed by the contact hole 522a, 522b is removed until the oxide layer 516 is exposed using the oxide layer 516 as an etching stop. Since the thickness of forming the oxide layer 516 is accurately controlled, the thickness of the oxide layer 518 etched to expose the oxide layer 516 can be controlled accurately. Hence, contact holes 522a, 522b are formed over the substrate 500, as shown as FIG. 5C. The source/drain regions 510, 514 and the portion of the STI structure 502 are exposed by the contact holes 522a, 522b. Since the contact hole 522b is formed in the logic region 506 after forming the dielectric layer 520a, the difference between the etched depths of the dielectric layer 520a in the memory region 504 and in the logic region 506 becomes smaller. Therefore, the borderless contact can be successfully formed without overetching the STI structure 502, as occurs in the conventional process.

Figure 5D:
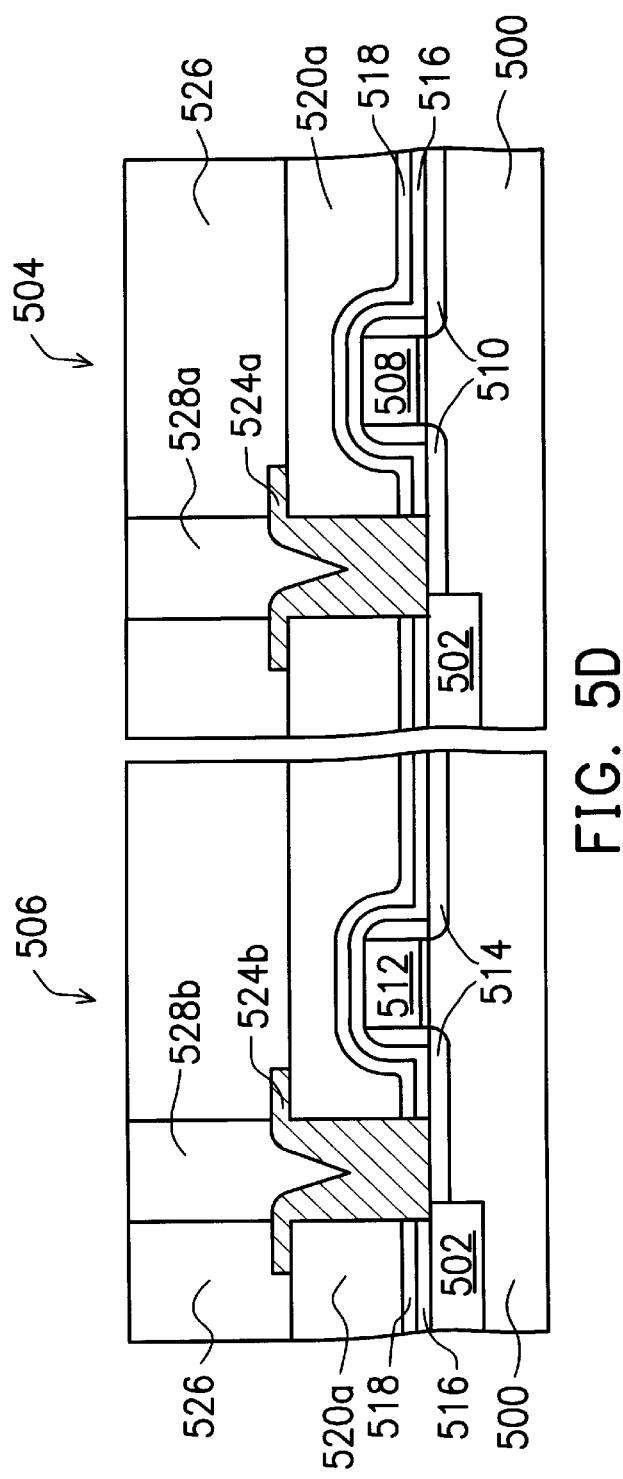

Referring to FIG. 5D, patterned suicide layers 524a, 524b are formed over the dielectric layer 520a to fill the contact holes 522a, 522b, for example, by a sputtering process. The exposed source/drain regions 510, 514 are covered. A portion of the silicide layer 524a, 524b extends to surface of the dielectric layer 520a neighboring the contact hole. The silicide layers 524a, 524b include, for example, $TiSi_x$. After forming memory cells (not shown) in the logic region 504, an inter-layer dielectric layer 526 is formed on the dielectric layer 520a. Vias are formed over the silicide layer 524a, 524b by defining the inter-layer dielectric layer 526. The vias are filled with a metal layer to form metal plugs 528a, 528b. The source/drain regions 510, 514 can be electrically coupled to the metal plugs 528a, 528b through the silicide layers 524a, 524b. The metal layer includes, for example, tungsten. A portion of the silicide layer 524a, 524b extends to the surface of the dielectric layer 520a neighboring the contact hole to increase areas which are capable of being electrically coupled to the metal plugs 528a, 528b. Therefore, the vias can be easily aligned after forming the dielectric layer 526.

According to the two embodiments mentioned above, in the invention, the contact holes are simultaneously formed in the memory region and in the logic region after forming the dielectric layer. Additionally, the silicide layers serve as the conductive layers in the contact holes. A junction between the source/drain region and the conductive layer, caused by using a polysilicon layer as the conductive layer, can be avoided. Moreover, during a step of defining the vias, etching stops in the memory region and in the logic region are the same and required etching depth of the dielectric layer in the logic region are lowered because of filling the silicide layer. Therefore, it can be much easier to define the vias. In addition, a borderless contact is introduced to reduce dimensions of a device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a self-aligned contact, wherein a substrate having a memory region and a logic region is provided, and metal oxide semiconductors (MOS) are respectively formed in the memory region and in the logic region, comprising the steps of:

forming a defined dielectric layer on the substrate;

forming a first contact hole in the dielectric layer in the memory region, and simultaneously forming a second contact hole in the logic region until the substrate is exposed;

forming a first silicide layer over the first contact hole and a second silicide layer over the second contact hole, respectively, to couple electrically the first silicide layer and the second silicide layer to the substrate, wherein portions of the first silicide layer and the second silicide layer respectively extend to the surface of the dielectric layer neighboring the first contact hole and the second contact hole;

forming a defined inter-layer dielectric layer over the substrate;

forming a first via in the logic region to expose the first silicide layer and a second via in the memory region until the second silicide layer is exposed; and forming a first metal plug in the first via and a second metal plug in the second via, respectively, to coupled electrically the first silicide layer and the second silicide layer.

2. The method according to claim 1, wherein the first silicide layer and the second silicide layer comprise titanium silicide.

3. The method according to claim 1, wherein the first silicide layer and the second silicide layer comprise cobalt silicide.

4. The method according to claim 1, wherein the step of forming the first silicide layer over the first contact hole and the second silicide layer over the second contact hole further comprises:

forming the defined third silicide layer on the dielectric layer; and forming the first silicide layer in the first contact hole and the second silicide layer in the second contact hole to couple electrically the first silicide layer and the second silicide layer to the substrate, wherein portions of the first silicide layer and the second silicide layer extend to the surface of the dielectric layer neighboring the first contact hole and the second contact hole.

5. The method according to claim 4, wherein the step of forming the defined third silicon layer comprises a sputtering process.

6. The method according to claim 4, wherein the step of forming the defined third silicon layer comprises a chemical vapor deposition process.

7. The method according to claim 1, wherein the first metal plug and the second metal plug comprise tungsten.

8. A method of fabricating a self-aligned contact, wherein a substrate having a memory region and a logic region is provided, a gate structure and a first source/drain region are formed in the memory region, and a dual gate structure and a second source/drain region are simultaneously formed in the logic region, comprising the steps of:

forming a defined dielectric layer on the substrate;

respectively forming contact holes in the dielectric layer in the memory region and in the logic region until the first source/drain region and the second source/drain region are exposed;

forming a defined silicide layer over the contact bole to couple the silicide layers in the memory region and in the logic region to the first source/drain region and the second source/drain region, wherein portions of the first silicide layer and the second silicide layer extend to surface of the dielectric layer neighboring the first contact hole and the second contact hole;

forming a defined inter-layer dielectric layer over the substrate;

respectively forming vias in the inter-layer dielectric layer in the memory region and in the logic region using the first silicide layer as an etching stop until the silicide layers are exposed; and forming defined plugs in the vias to couple electrically the metal plugs in the memory region and in the logic region to the silicide layers in the memory region and in the logic region.

9. The method according to claim 8, wherein the silicide layer comprises tungsten silicide.

10. The method according to claim 8, wherein the first silicide layer and the second silicide layer comprise cobalt silicide.

11. The method according to claim 8, wherein the first metal plug and the second metal plug comprise tungsten.

12. The method according to claim 8, wherein the step of forming the silicide layer comprises a sputtering process.

13. The method according to claim 8, wherein the step of forming the silicide layer comprises a chemical vapor deposition process.

14. A method of fabricating a self-aligned contact, wherein a substrate having a memory region and a logic region is provided, a gate structure and a first source/drain region is formed in the memory region, and a dual gate structure and a second source/drain region is simultaneously in the logic region, comprising the steps of:

sequentially forming an oxide layer, a hard material layer and a defined dielectric layer over the substrate;

respectively forming contact holes in the dielectric layer in the memory region and the logic region using the hard material layer as an etching stop until the oxide layers are formed;

respectively removing the exposed oxide layers in the memory region and the logic region until the first source/drain region and the second source/drain are exposed;

forming a defined silicide layer over the contact hole to couple the silicide layers in the memory region and in the logic region to the first source/drain region and the second source/drain region, respectively, wherein portions of the silicide layer extend to surface of the dielectric layer neighboring the contact hole;

forming a defined inter-layer dielectric layer over the substrate;

respectively forming vias in the memory region and in the logic region using the first silicide layer as an etching stop until the silicide layer is exposed; and forming defined metal plugs in the vias to couple electrically the metal plugs in the memory region and in the logic region to the silicide layer in the memory region and in the logic region.

15. The method according to claim 14, wherein the hard material layer comprises silicon nitride layer.

16. The method according to claim 14, wherein the silicide layer comprises tungsten silicide.

17. The method according to claim 14, wherein the silicide layer comprises cobalt silicide.

18. The method according to claim 14, wherein the metal plugs comprises tungsten.

19. The method according to claim 14, wherein the step of forming the silicide layer comprises a sputtering process.

20. The method according to claim 14, wherein the step of forming the silicide layer comprises a chemical vapor deposition process.

* * * * *